United States Patent [19]

Bush

[11] Patent Number: 4,977,514

[45] Date of Patent: Dec. 11, 1990

[54] OVERLAID DIGITAL WAVEFORMS DISPLAY

[75] Inventor: Kevin M. Bush, Colorado Springs, Colo.

[73] Assignee: Hewlett Packard Company, Palo Alto, Calif.

[21] Appl. No.: 405,105

[22] Filed: Sep. 8, 1989

Related U.S. Application Data

[63] Continuation of Ser. No. 47,948, May 8, 1987, abandoned.

[51] Int. Cl.$^5$ .................. G06F 15/20; G09G 1/16
[52] U.S. Cl. ................ 364/487; 364/521; 324/121 R; 324/77 R; 340/734; 340/716
[58] Field of Search .............. 364/487, 521, 518; 324/78 D, 77 R, 77 A, 121 R; 340/715, 716, 718, 720, 721, 734

[56] References Cited

U.S. PATENT DOCUMENTS

| | | | |
|---|---|---|---|
| 4,455,613 | 6/1984 | Shoemaker | 364/487 |
| 4,516,119 | 5/1985 | Fukuta | 340/722 |
| 4,560,981 | 12/1985 | Jackson et al. | 340/721 |
| 4,599,611 | 7/1986 | Bowker et al. | 340/721 |
| 4,634,970 | 1/1987 | Payne et al. | 324/121 R |
| 4,673,931 | 6/1987 | Cunningham, Jr. | 324/121 R |
| 4,697,138 | 9/1987 | Morishita et al. | 324/121 R |

OTHER PUBLICATIONS

Digital Analysis System 9200, "Introducing The New Dimensions of Analysis Power and Operating Simplicity", Tektronix, 1986, pp. 4 & 6.
DAS 9200, Tektronix, 1986, pp. 12 & 18.

Primary Examiner—Parshotam S. Lall
Assistant Examiner—V. N. Trans
Attorney, Agent, or Firm—Christopher J. Byrne

[57] ABSTRACT

Provided is a an overlaid digital signal waveform display for a logic analyzer. The present invention allows the logic analyzer user to overlay, that is superimpose, individual digital waveforms within a functional group of waveforms onto each other so that all the waveform transitions within the group appear at one level across the display screen of the logic analyzer. Thus, all waveforms within a functional group, such as all the address line waveforms of an address bus, can be overlaid onto each other. In addition, individual waveforms within the group can be shown isolated from the overlaid group.

8 Claims, 11 Drawing Sheets

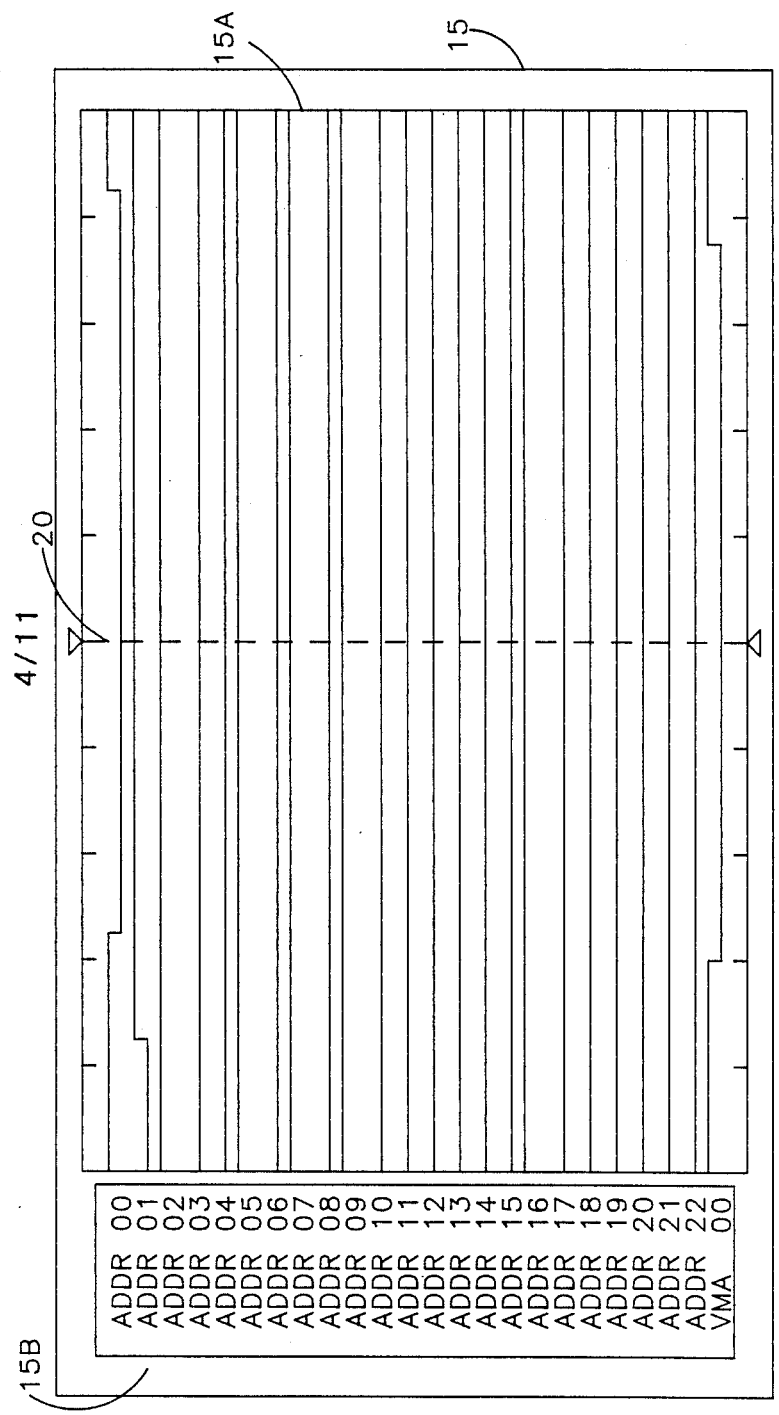

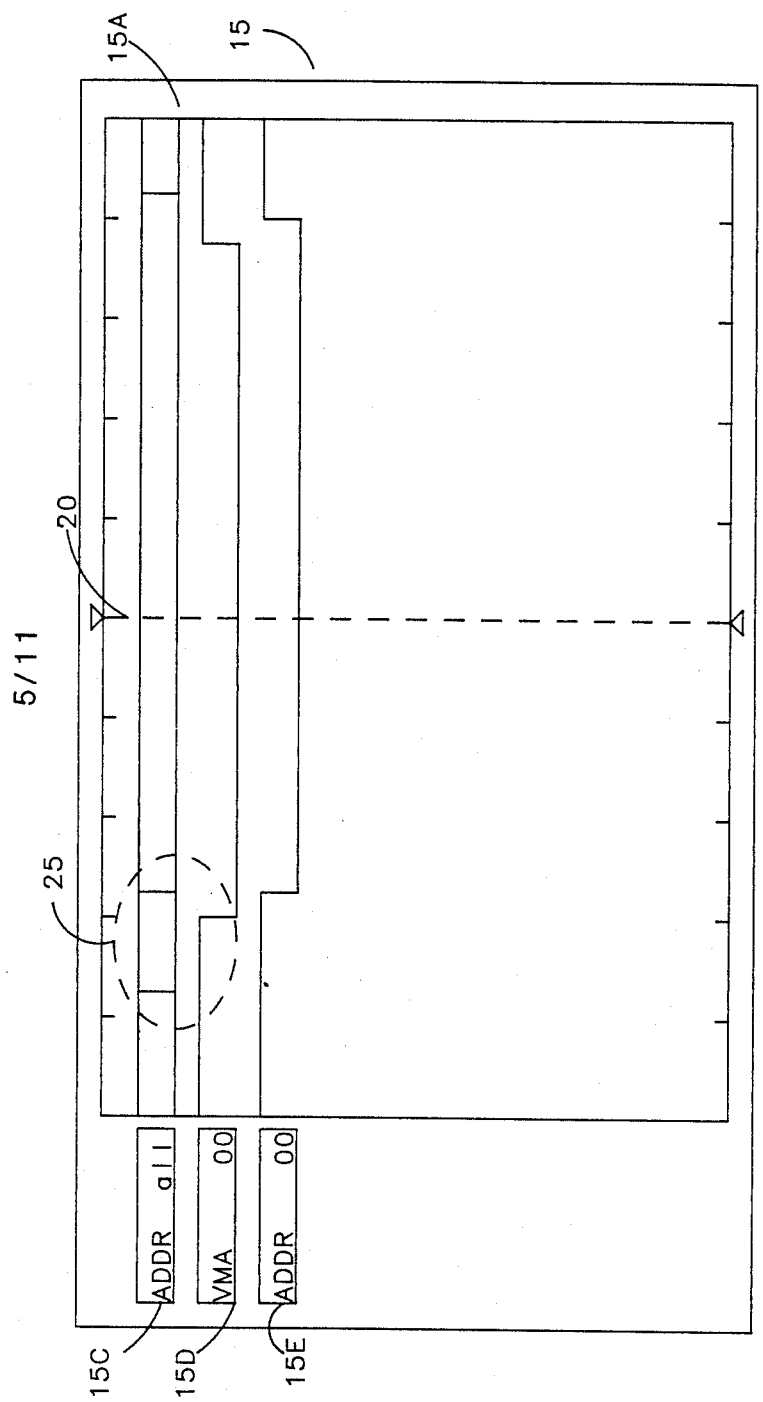

| SAMPLE PERIOD | DIGITIZED SAMPLE | DISPLAY VALUE | TIME-UNIT |
|---|---|---|---|
| $t_n$ | 1 | H | $U_0$ |
| $t_{n+1}$ | 1 | H | |
| $t_{n+2}$ | 1 | H | $U_1$ |
| $t_{n+3}$ | 1 | H | |
| $t_{n+4}$ | 1 | L,E | $U_2$ |
| $t_{n+5}$ | 0 | L | |
| $t_{n+6}$ | 0 | L | $U_3$ |
| $t_{n+7}$ | 0 | H,E | |
| $t_{n+8}$ | 1 | H | $U_4$ |
| $t_{n+9}$ | 1 | H | |
| $t_{n+10}$ | 1 | H | $U_5$ |
| $t_{n+11}$ | 1 | H | |
| $t_{n+12}$ | 1 | L,E | $U_6$ |
| $t_{n+13}$ | 1 | L | |
| $t_{n+14}$ | 0 | L | $U_7$ |
| $t_{n+15}$ | 0 | L | |
| $t_{n+16}$ | 0 | L | $U_8$ |
| $t_{n+17}$ | 0 | H,E | |
| $t_{n+18}$ | 0 | | $U_9$ |
| $t_{n+19}$ | 1 | | |

H=HIGH
L=LOW
E=TRANSITION EDGE

FIG 5A (PRIOR ART)

OVERLAID DIGITAL WAVEFORMS DISPLAY

This application is a continuation of application Ser. No. 07/047,948, filed May 8, 1987, now abandoned.

BACKGROUND OF THE INVENTION

A logic analyzer is an electronic instrument used to detect, analyze and display digital voltage signals. Typically, a digital voltage signal conveys binary information, that is, the signal is either logic "high" or logic "low." For instance, according to one convention, if the signal voltage is above a given threshold value it is "high" whereas if it is below the threshold value it is "low." (In conventional binary logic, "high" represents a "1" and "low" represents a "0".) Since the signal carries binary information, that is, 1's and 0's, it is the signal's transition above or below the threshold value, rather than its absolute value, that is important.

Like an oscilloscope, the logic analyzer typically displays a signal's waveform as a function of voltage-versus-time with voltage amplitude displayed along a vertical axis and time displayed along a horizontal axis. Unlike an oscilloscope, however, the logic analyzer typically does not display high vertical (that is, voltage) resolution. Rather, for a given signal the logic analyzer waveform will resemble a square-wave and therefore be either "high" or "low." In fact, since the logic analyzer's primary purpose is to display a signal's transitions from 1's to 0's, that is, from logic "high" to logic "low", the square-wave waveform is both adequate and ideal.

Typically, the logic analyzer displays the digital waveforms of many individual signals at once, such as the signals on the multiple lines of a data-bus or an address-bus. The typical logic analyzer can show sixteen digital waveforms at once. Thus, on such an analyzer the signals on the sixteen lines of a 16-bit address bus would be shown as sixteen individual square-wave waveforms positioned from the top to the bottom of the display screen. The user of the logic analyzer can then view the sixteen waveforms simultaneously in a single display.

Typically, the viewer is most interested in comparing the transitions from high to low of numerous waveforms, such as a comparison of the transitions on certain address lines of a microprocessor with the transitions on certain control lines. Unfortunately, the most important information contained in such a display may be difficult to discern, particularly given that the screen may be updated at the rate of 1-to-20 times per second.

SUMMARY OF THE INVENTION

The present invention significantly enhances the visual comparability of logic analyzer waveforms with an optional overlaid waveform display feature. The present invention provides an overlaid-channel-group feature such that all the waveforms in a particular channel-group of signals having a like function, such as a group of address-bus signals, can be overlaid on a single line and viewed as a single unit. Therefore, the viewer is not required to visually scan up and down the display screen to compare transitions between individual waveforms. Moreover, the present invention allows the user to isolate any one signal waveform within a channel-group of overlaid waveforms so that the isolated waveform can be viewed separately.

The present invention's channel-grouping and isolating features have several advantages For instance, when troubleshooting a system, the user can examine channels by function group to quickly scan for errors within that group. If an error is suspected in a given group then individual waveform members of the group can be isolated until the channel in error is determined. Together, the overlaying and the isolating features significantly enhance the user's ability to detect errant channels in a functional group of channels and reduce the debugging time required to accomplish such detection. Generally, overlaying waveforms by channel group allows for a denser display of waveforms with reduced viewer confusion.

For instance, in a typical application of a logic analyzer, the logic analyzer user may want to compare the signals on the address lines (ADDR) of a microprocessor with the signal on the valid-memory-address (VMA) line of an I/0 device. With prior art devices, the user would have to examine each of the separate ADDR line signal waveforms against the VMA waveform. Even assuming that all the waveforms of interest could be shown simultaneously on one display screen, visually scanning up and down the screen to compare transitions between waveforms is a tedious visual task, as is clear from FIG. 4A. In particular the viewer may want to determine if any ADDR signal transitions after VMA is low. Such a determination requires careful scanning in FIG. 4A and a comparision of 24 separate waveforms. FIG. 4A shows twenty-three adrress line waveforms, ADDR 00 through ADDR 22, and one VMA line waveform, VMA 00, as labelled in window 15B. Note in FIG. 4A that ADDR lines 02, 05, 07, 09, and 16 are all high; ADDR lines 03, 04, 06, 08, 10 through 15, and 17 through 21 are all low; ADDR line 00 transitions from high-to-low-to-high; ADDR line 01 transitions from low-to-high; and VMA transitions from high-to-low-to-high. Careful scanning within FIG. 4A shows that ADDR line 00 is the offending line, that is, the signal on ADDR line 00 transitions after VMA has gone low.

With the present invention, however, the user can overlay the ADDR waveforms so that only two quantities have to be examined: the overlaid ADDR waveforms and the VMA waveform, as shown in FIG. 4B. It should be noted that FIG. 4B shows precisely the same information as FIG. 4A, except that ADDR lines 00 through 22 are overlaid and that ADDR 00 is isolated. Hence, the input information is identical but the display mode has changed. Overlaying the waveforms, as in FIG. 4B, increases the ease with which the viewer can examine the interaction of waveform transitions within a single channel-group, such as within the ADDR group, as well as interactions between groups, such as between the ADDR group and the VMA waveform. In FIG. 4B, ADDR waveform transitions are shown as vertical edges at level "ADDR all" in window 15A. In particular, it is easier in FIG. 4B, versus FIG. 4A, to determine if any ADDR waveforms transition after VMA is low, such as the rightmost transition in bubble 25 of FIG. 4B. Note also that overlaying the ADDR waveforms in FIG. 4B increases the display efficiency in window 15A versus window 15A in FIG. 4A. Hence, window 15A in FIG. 4B can accommodate additional waveforms below the VMA waveform, such as the isolated waveform ADDR 00 (which is the offending waveform from the ADDR group) and/or an additional functional group of waveforms such as a DATA group.

BRIEF DESCRIPTION OF THE DRAWINGS

FIG. 4A shows a sample logic analyzer display which is typical of the prior art.

FIG. 4B shows the display of FIG. 4A following application of the present invention.

FIG. 5A shows a method for mapping more than one sample period to one pixel.

DESCRIPTION OF THE PREFERRED EMBODIMENT

Figure 1:
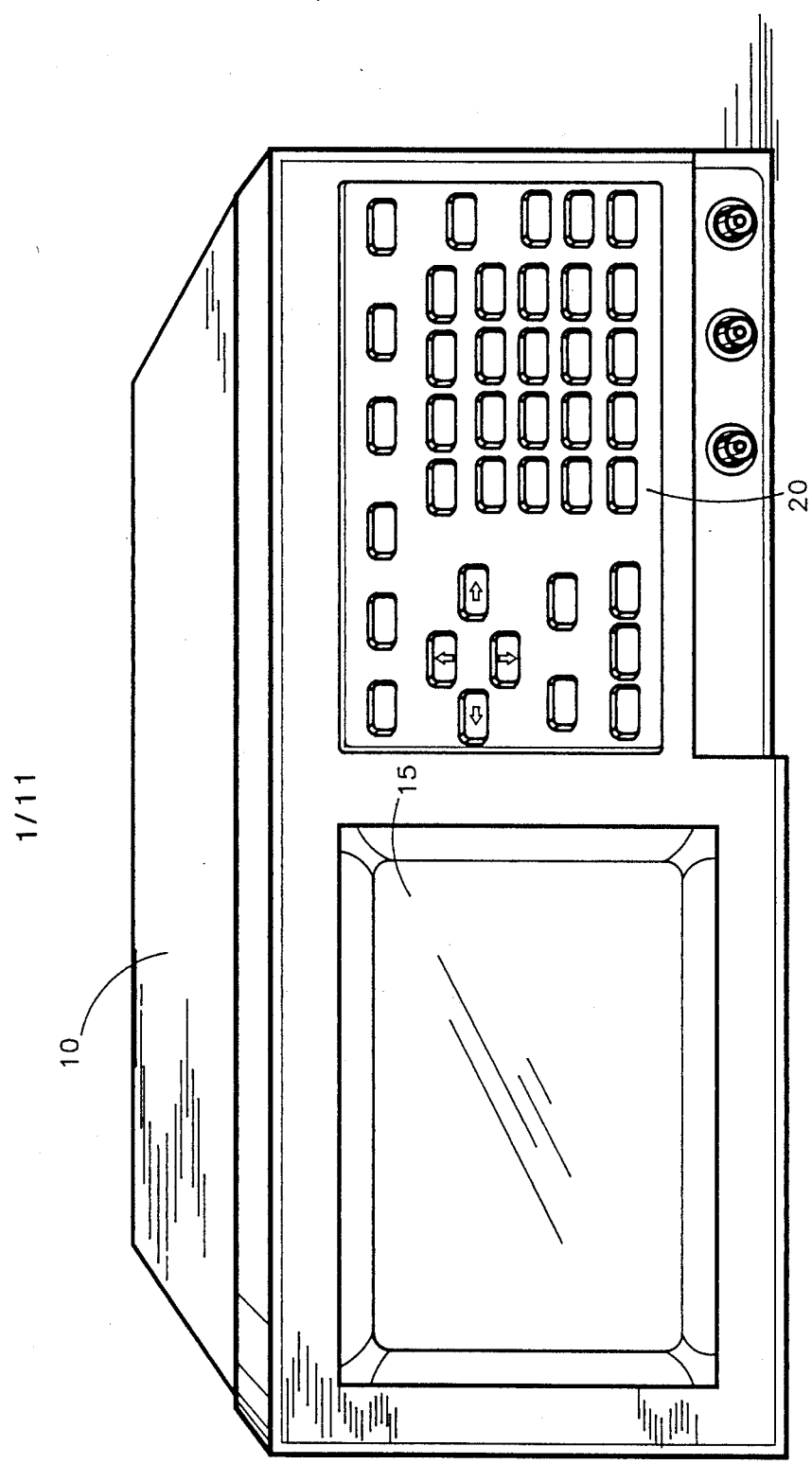
FIG. 1 shows a frontal view of a logic analyzer such as would be used with the present invention.

FIG. 1 shows a frontal view of a logic analyzer 10, such as would be used with the present invention. Logic analyzer 10 is user-controlled with keyboard 20. Digital signal square-wave waveforms are displayed on cathode ray tube (CRT) display screen 15.

Figure 2:
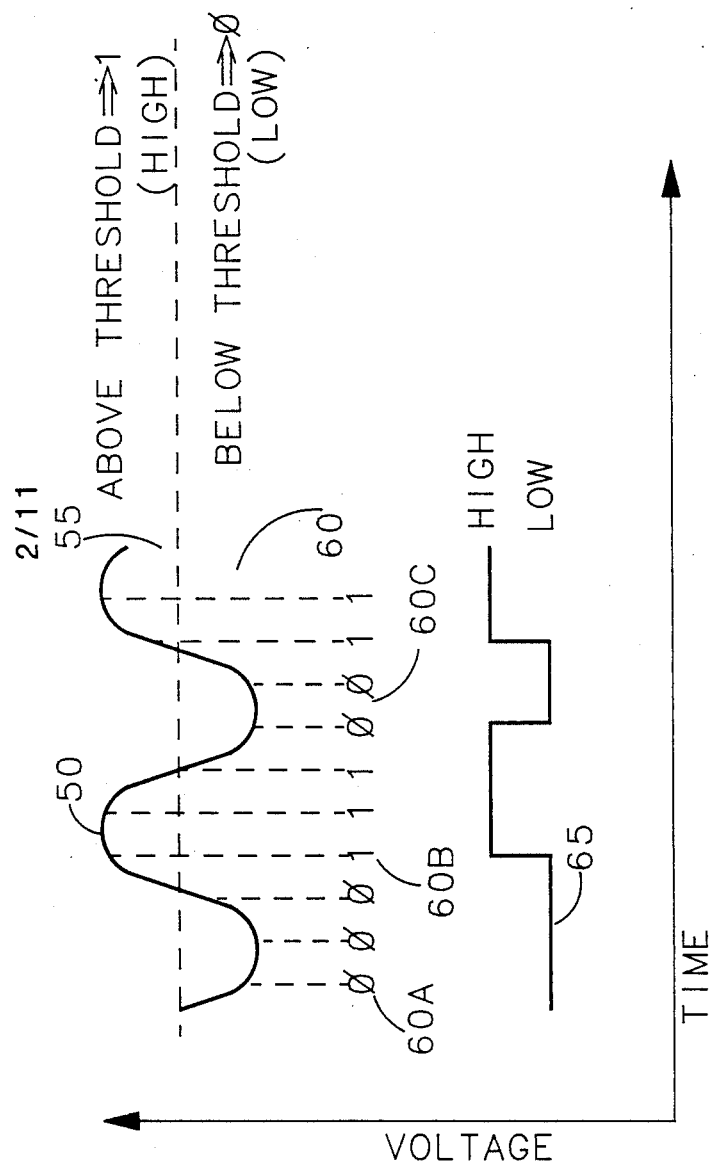
FIG. 2 shows how an input signal is digitized and the digital information converted into a square-wave like waveform.

FIG. 2 shows how a signal 50 is converted into a square-wave like waveform 65. Signal 50 is a voltage signal having a changing voltage amplitude. Given an arbitrary voltage threshold level 55, signal 50 may be regarded as being either above or below threshold level 55 at any given time. Signal 50 may then be sampled at discrete time intervals 60. At each sampling interval, signal 50 will either be above or below threshold level 55. Convention dictates that when the signal 50 sample value is below threshold level 55, that sample is considered to be logic low, that is, 0. Likewise, when the signal 50 sample value is above threshold level 55, that sample is considered to be logic high, that is, 1. Signal 50 sample values may then be converted into binary logic 1's and 0's. For instance, at sample interval 60A, signal 50 is below threshold level 55 so that sample 60A is a 0. At sample interval 60B, signal 50 is above threshold level 55 so that sample 60B is a 1. Likewise, at sample interval 60C, signal 50 is again below threshold level 55 so that sample 60C is a 0. Finally, square-wave waveform 65 may be constructed from the time-ordered sequence 60 of 0's and 1's generated from sampling signal 50. As can be seen from FIG. 3, square-wave waveform 65 is high when signal 50 is above threshold level 55, that is, when the sample values 60 are 1's. Likewise, square wave waveform 65 is low when signal 50 is below threshold level 55, that is, when the sample values 60 are 0's. Digitizing a signal, that is, converting a changing voltage signal to 1's and 0's based upon whether the signal is above or below a given threshold, allows for representing the signal as a square-wave, such as representing signal 50 with square-wave 65. Moreover, the digitized values, that is the 1's and 0's, may be easily stored and manipulated in memory.

Figure 3:
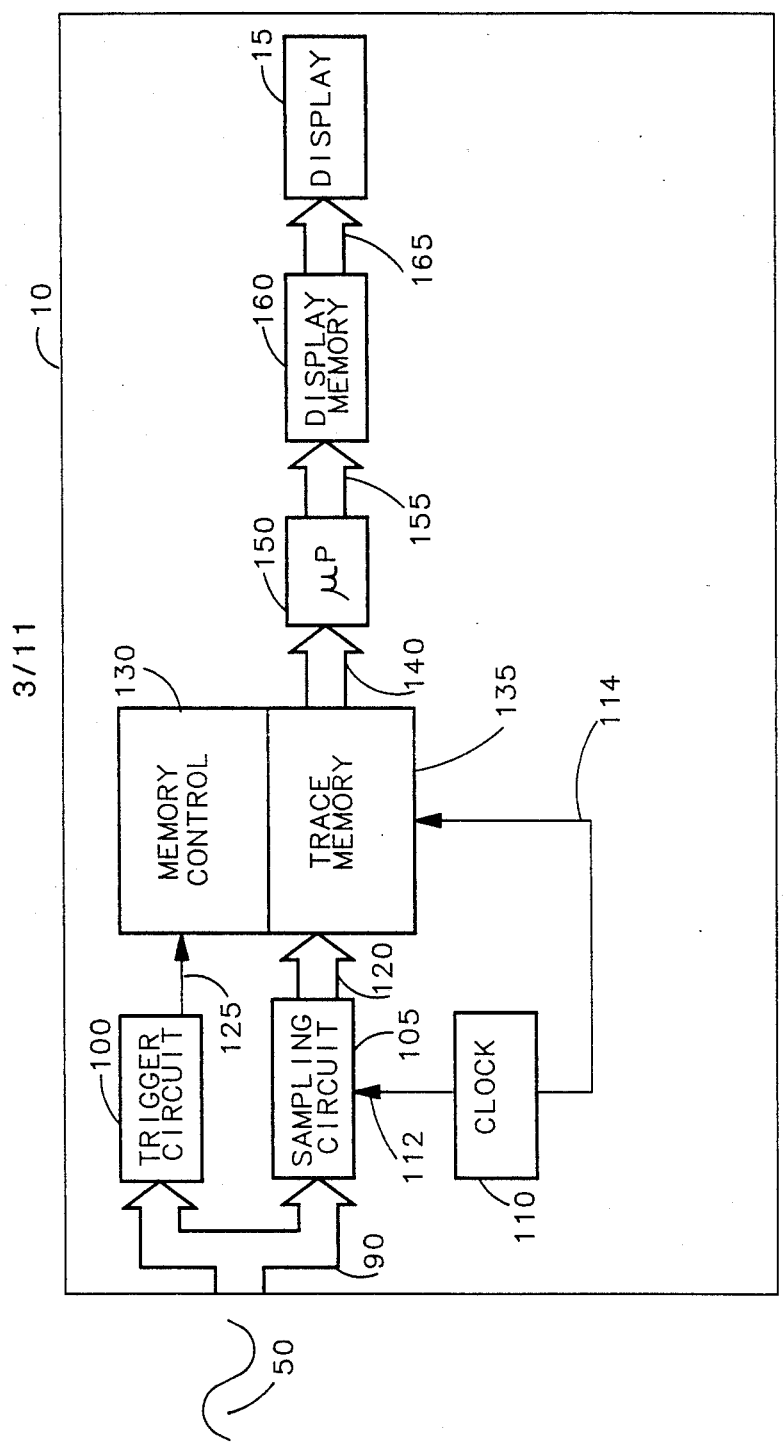
FIG. 3 shows a functional block diagram of a logic analyzer.

FIG. 3 shows a functional block diagram of logic analyzer 10. A signal, such as signal 50, is input to logic analyzer 10 and applied via bus 90 to trigger circuit 100 and sampling circuit 105. (It should be observed that logic analyzer 10 can process multiple input signals in parallel, as suggested by bus 90, but only a single input signal 50 is discussed herein for the sake of explanation of FIG. 3. The functional process which is described herein concerning single signal 50 can occur in parallel if multiple signals are input in parallel.) Sampling circuit 105 digitizes signal 50, that is, it converts signal 50 into 1's and 0's in the manner described in connection with FIG. 2. Sampling circuit 105 samples signal 50 at regular periodic intervals defined by sample clock 110. Clock 110 emits clock signals which activate both sampling circuit 105 and trace memory 135 via lines 112 and 114 respectively. The time length of each interval is known as the sample-period. The sample-period is user-defined via sample clock 110. The digitized sampling information generated by sampling circuit 105, that is, the 1's and 0's, are stored in trace memory 135 via bus 120. However, trigger circuit 100 defines a trigger condition which input signal 50 must meet before the sampling can begin. Trigger circuit 100 essentially activates logic analyzer 10 in that regard. If the trigger condition is met by input signal 50, trigger circuit 100 emits a signal via line 125 to memory control circuit 130 which allows the sample values that are generated by sampling circuit 105 to be stored in trace memory 135. The digitized sampling information which is stored in trace memory 135 is then read and processed by microprocessor 150 via bus 140, according to predetermined programs. Using the digitized information, microprocessor 150 generates display waveforms which it writes into display memory 160 via bus 155. Display memory 160 is then mapped onto display 15 via bus 165 to produce the square-wave waveforms which are visible to the viewer.

FIG. 4A shows a sample logic analyzer display which is typical of the prior art. FIG. 4A shows twenty-three address-bus signals (labelled ADDR 00 through ADDR 22 in window 15B) and a valid memory address signal (labelled VMA 00 in window 15B). Each signal is represented by a digital square-wave waveform in window 15A. Each waveform in window 15A is separate and therefore the viewer must visually scan up and down window 15A to determine the interaction of high-to-low transitions between waveforms. In particular, the viewer may want to know if any address signals transition after VMA is low, which would indicate an error. To determine if such an error exists in FIG. 4A, the viewer has to visually scan up and down window 15A. (Center line 20 is displayed for viewer reference.) Note in FIG. 4A that ADDR signals 02, 05, 07, 09 and 15 are all high; ADDR signals 03, 04, 06, 08, 10 through 15, and 17 through 21 are all low; ADDR signal 00 transition from high-to-low-to-high; ADDR 01 transitions from low-to-high; and VMA transitions from high-to-low-to-high. Careful scanning of FIG. 4A shows that ADDR 00 is the offending signal, that is, it transitions after VMA has gone low.

FIG. 4B shows the display of FIG. 4A following application of the present invention. In particular, the overlay feature of the present invention increases display efficiency by superimposing waveforms of like function, such as the ADDR waveforms. Overlaying also enhances the visual comparability of transitions between waveforms: because the overlaid waveforms are superimposed, transitions between logic high and logic low are shown as vertical edges all at the same level on the display screen. In FIG. 4B all the transitions of the twenty-three address signals are shown as vertical edges across window 15A at the level labelled "ADDR all" in window 15C. Since all the transitions are at one level, the viewer does not have to visually scan up and down window 15A. In particular, it is easier in FIG. 4B, versus FIG. 4A, to determine if any ADDR waveforms transition after VMA goes low, such as the right-most vertical transition edge in bubble 25. Note also that the overlaying in FIG. 4B increases the display efficiency in window 15A such that there is additional display space below the VMA waveform (labelled VMA 00 in window 15D). In particular, the extra display space can be used for the isolating feature of the present invention. Note that offending waveform (ADDR 00, as shown at the level labelled ADDR 00 in window 15E) can be shown isolated from the overlaid group. (Center line 20 is shown for viewer reference.)

Figure 5:
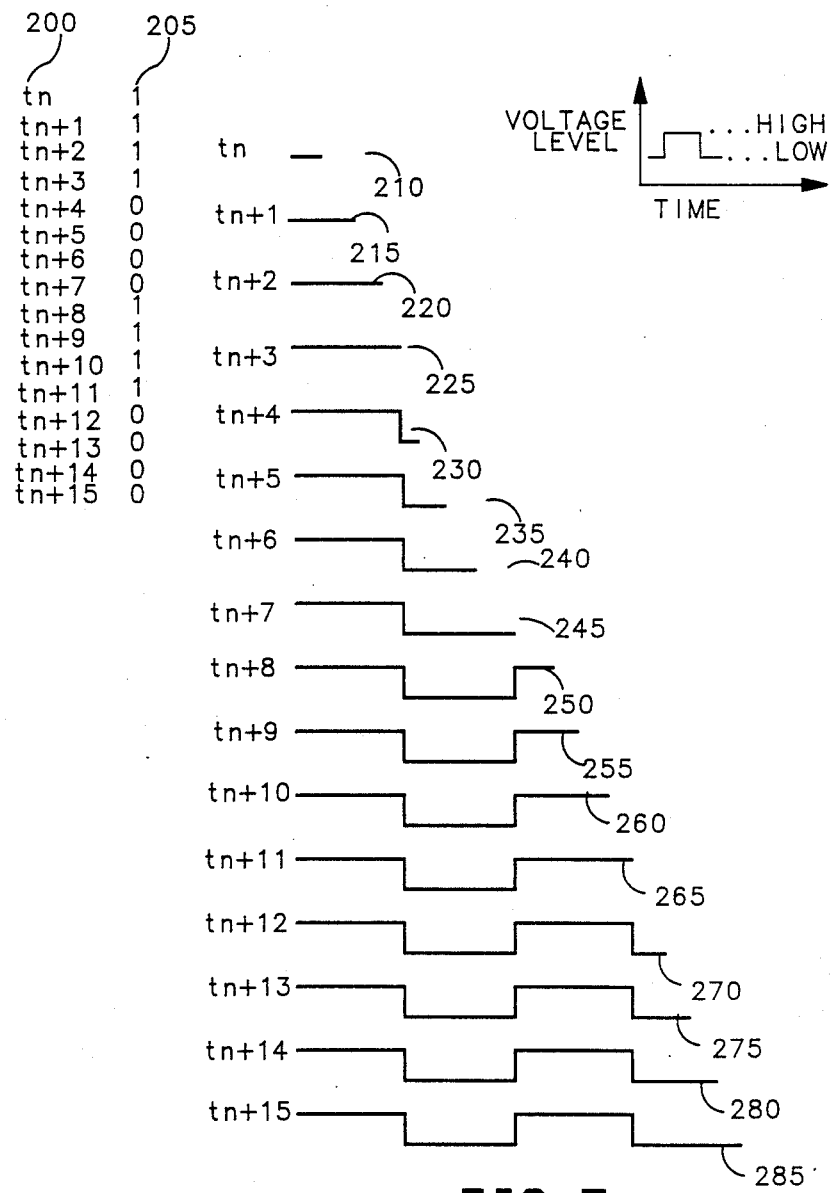
FIG. 5 shows how digitized waveform information for a single waveform is mapped into a single-waveform display.

FIG. 5 shows how digitized waveform information for a single input signal is mapped into a single square-wave waveform display. On the far left in FIG. 5 is a column 200 of sixteen sample-periods marked $t_n$ through $t_{n+15}$. To the right of column 200 is a column 205 of digital values, that is, 1's, and 0's, which correspond to the digitized sample values of the input signal for each corresponding sample-period. Thus, for sample period $t_n$ the digitized sample value is 1; for sample-period $t_n$ the digitized sample value is 0; for sample-period $t$ the digitized sample value is 1, and so forth. Moreover, the sample-periods are numbered chronologically in time such that $t_n$ designates the first sample value acquired, $t_{n+1}$ designates the second sample value acquired, and so forth. In practice, the digitized sample values in column 205 may be stored in memory at chronologically ordered addresses. Thus, column 200 be regarded as an ordered sequence of sixteen 1-bit memory addresses wherein each address correpsonds to a sample-period. Therefore, at each address is the digitized sample value, represented by the 1's and 0's in adjacent column 205, of the input signal for the sample-period corresponding to that address. The digitized sample values can be mapped from memory onto a raster display as shown on the left in FIG. 5. Final square-wave waveform 285 represents a direct mapping of the information in memory column 200 onto a raster display screen. The time-units of horizontal time axis 207 of the display screen correspond to addresses in column 200. (In a raster display, the time-units 207 would be implemented with pixels such that the number of time-units across the screen equals the number of pixels in a horizontal line across the screen.) The mapping scheme between memory and the display is as follows: given the correspondence between memory-address column 200 and horizontal time axis 215 of the display, where there are 1's in memory 205, waveform 285 is high in the corresponding time-unit of the display; and where there are 0's in memory 205, waveform 285 is low in the corresponding time-unit of the display. The digitized information in column 205 is mapped onto the display screen in serial order such that the final waveform 285 is drawn onto the display screen, from left to right, in a sequence of segments shown by segmental waveforms 210 through 280. Throughout this specification, "drawing a waveform" is a phrase used in reference to well know prior art techniques for mapping digitized waveform information from memory onto a display screen. For the sake of explanation it has been assumed that one sample-period in memory, such as $t_{n+2}$ in column 200, maps into one unit of time on the horizontal time axis of the display screen, such time-unit $t_{n+2}$ in time axis 207. However, the correspondence between sample-periods in memory and time-units on the display screen need not be one-to-one. For instance, if the ratio X=(number-of-time-units/number-of-sample-periods) is a number greater than one or equal to one, then each sample-period will map into X adjacent time-units. On the other hand, if the ratio X is less than one, that is, there is more than one sample-period for each time-unit, then an alternate routine for mapping the sample-periods onto the time-units must be chosen. For instance, if X=½ then the mapping routine may perform logical gate operations on each pair of sample values corresponding to each time-unit to determine each pair's display value and draw the corresponding time-unit high, low or as a transition edge accordingly. FIG. 5A shows such a method for the case where X=½. Table 290 in FIG. 5A shows twenty sample periods ($t_n$ through $t_{n+19}$) having digitized samples. The display value (H=high, L=low, E=transition edge) for each digitized sample is shown to the right of each digitized sample Note that an E display value will appear where the digitized sample for sample period $t_x$ differs from the digitized sample for sample period $t_{x-1}$. Time-units ($U_0$ through $U_9$) on display screen 295 are implementred with pixels, where each dot represents a pixel and each large dot represents an illuminated pixel. Each time-unit corresponds to a pair of sample periods, as listed in table 290. The corresponding display screen 295 time-unit ($U_0$ through $U_9$) for a given pair of sample periods will exhibit the display values (H, L, E) listed for that time-unit in table 290. For instance, time-un $U_0$ has display values H,H in table 290 so time-unit $U_0$ in display screen 295 shows a pixel illuminated in the high position. Likewise, time-unit $U_3$ in table 290 has display values L,L so time-unit $U_3$ in display screen 295 shows a pixel illuminated in the low position. Likewise, time-unit $U_2$ has display values H,L,E in table 290 so time-unit $U_2$ in display screen 295 shows an illuminated vertical transition edge of pixels. Fundamentally, however, the most important principle is that whatever the value of X, the mapping routine will incorporate a predetermined relationship between the sample-periods in memory and the time-units on the display screen.

Figure 6:
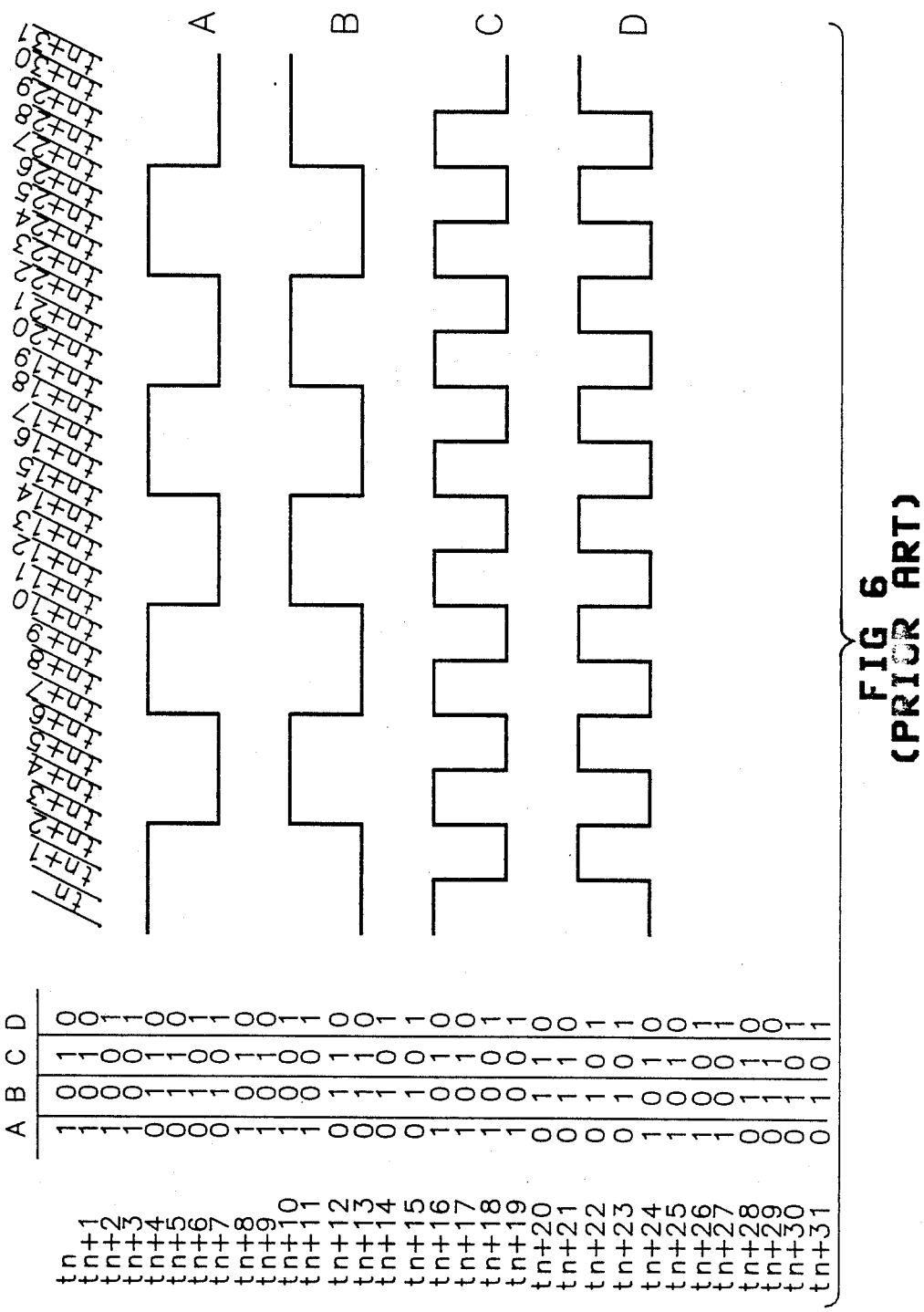
FIG. 6 shows how digitized waveform information for multiple waveforms is mapped into a multiple-waveform display.

FIG. 6 shows how digitized waveform information for multiple waveforms is mapped into a multiple-waveform display. Using mapping as described in connection with FIG. 5, we see in FIG. 6 that the digitized information in column A maps into waveform A; the digitized information in column B maps into waveform B; the digitized information in column C maps into waveform C; and the digitized information in column D maps into waveform D. The waveforms A, B, C and D are simply mapped onto the display screen separately from each other, each starting at a different level on the display screen, using the mapping scheme described in connection with FIG. 5.

Figure 7:
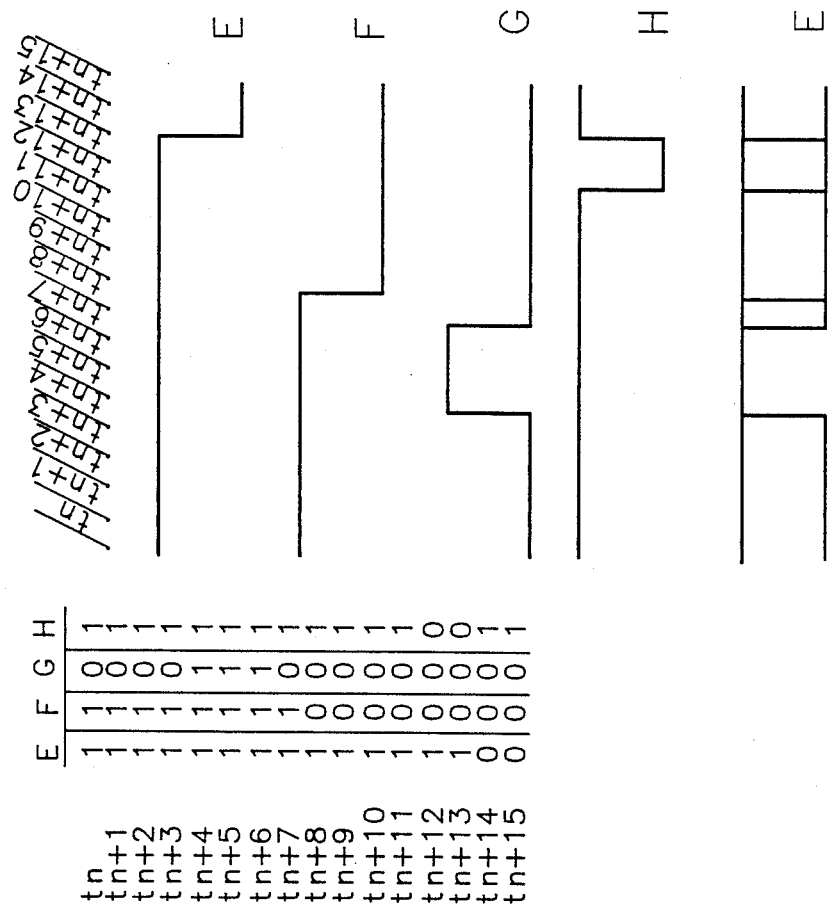
FIG. 7 shows a sequential method for mapping multiple waveform digitized information into an overlaid waveform display.

FIG. 7 shows a sequential method for mapping multiple-waveform digitized information into an overlaid waveform display. Using mapping as described in connection with FIG. 6, we see in FIG. 7 that the digitized information in column E maps into waveform E; the digitized information in column F maps into waveform F; the digitized information in waveform G maps into waveform G; and the digitized information in column H maps into waveform H. The waveforms E, F, G and H are simply mapped onto the display screen seprately from each other, each starting at a different height on the display screen, using the mapping scheme described in connection with FIG. 5. Finally, waveforms E, F, G and H can be overlaid, that is, superimposed on each other, by starting the mapping of each waveform at the same height on the display screen. FIG. 7 shows each of the waveforms (E,F,G and H) separately as well as the result of overlaying the waveforms. The waveforms are shown separately in FIG. 7 only as aid to explantion. In actual use of the sequential method, only the overlaying result is shown. First waveform E is mapped onto the screen starting at a given height on the display screen; then waveform F would be mapped overlaid onto waveform E; then waveform G would be mapped overlaid onto waveforms E and F; then waveform H would be mapped overlaid onto waveforms E, F and G; that is, the overlaid waveforms appear one waveform at a time until the full overlaid result is achieved.

Figure 8:
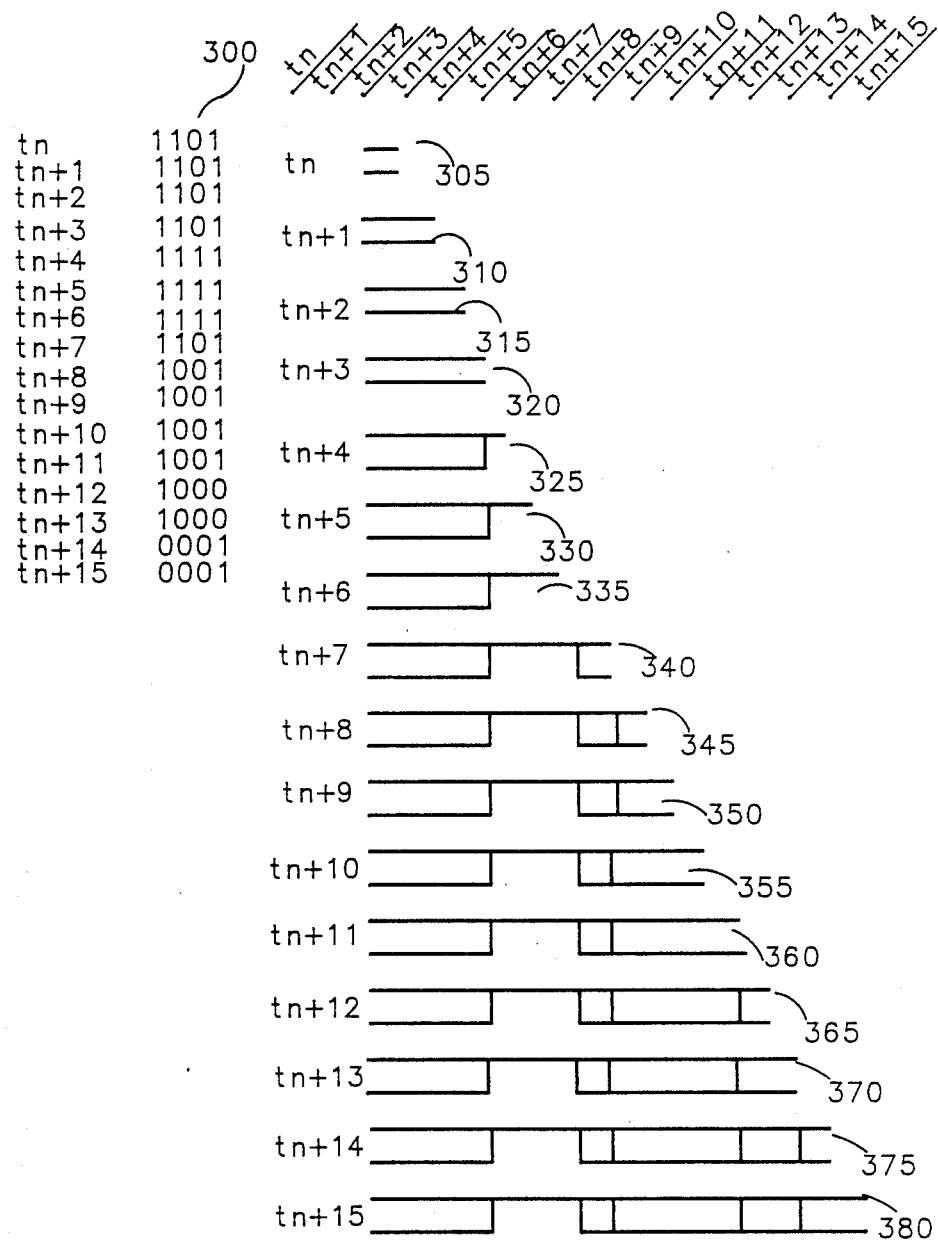
FIG. 8 shows a parallel method for mapping multiple-waveform digitized information into an overlaid waveform display.

FIG. 8 shows a parallel method for mapping multiple waveform digitized information into an overlaid waveform display As can be seen from a comparison of FIG. 7 with FIG. 8, the digitized information in memory 300 of FIG. 8 is identical to the digitized information in columns E, F, G and H in FIG. 7. The digitized information in memory 300 of FIG. 8 can be mapped onto a display screen using a parallel method to produce final overlaid waveform 380. Note that overlaid waveform 380 of FIG. 8 is identical to overlaid waveforms E, F, G and H of FIG. 7 because the same digitized information is used to produce both sets of overlaid waveforms. However, the digitized waveform information in memory 300 of FIG. 8 is mapped onto the display screen in parallel such that final overlaid waveform display 380 is drawn onto the display screen, from left to right, in the sequential segments as shown in segmental waveforms 305 through 380. Thus, the difference between the sequential method of FIG. 7 and the parallel method of FIG. 8 is that in the sequential method each member waveform of the overlaid group of waveforms is drawn onto the display screen one at a time, in sequential order; in the parallel method, on the other hand, the entire overlaid waveform group is drawn at one from left-to-right across the screen. (Also, as discussed in connection with FIG. 5, the sample periods in memory have a predetermined relationship, not necessarily one-to-one, to time-units on the display screen.)

Figure 8A:
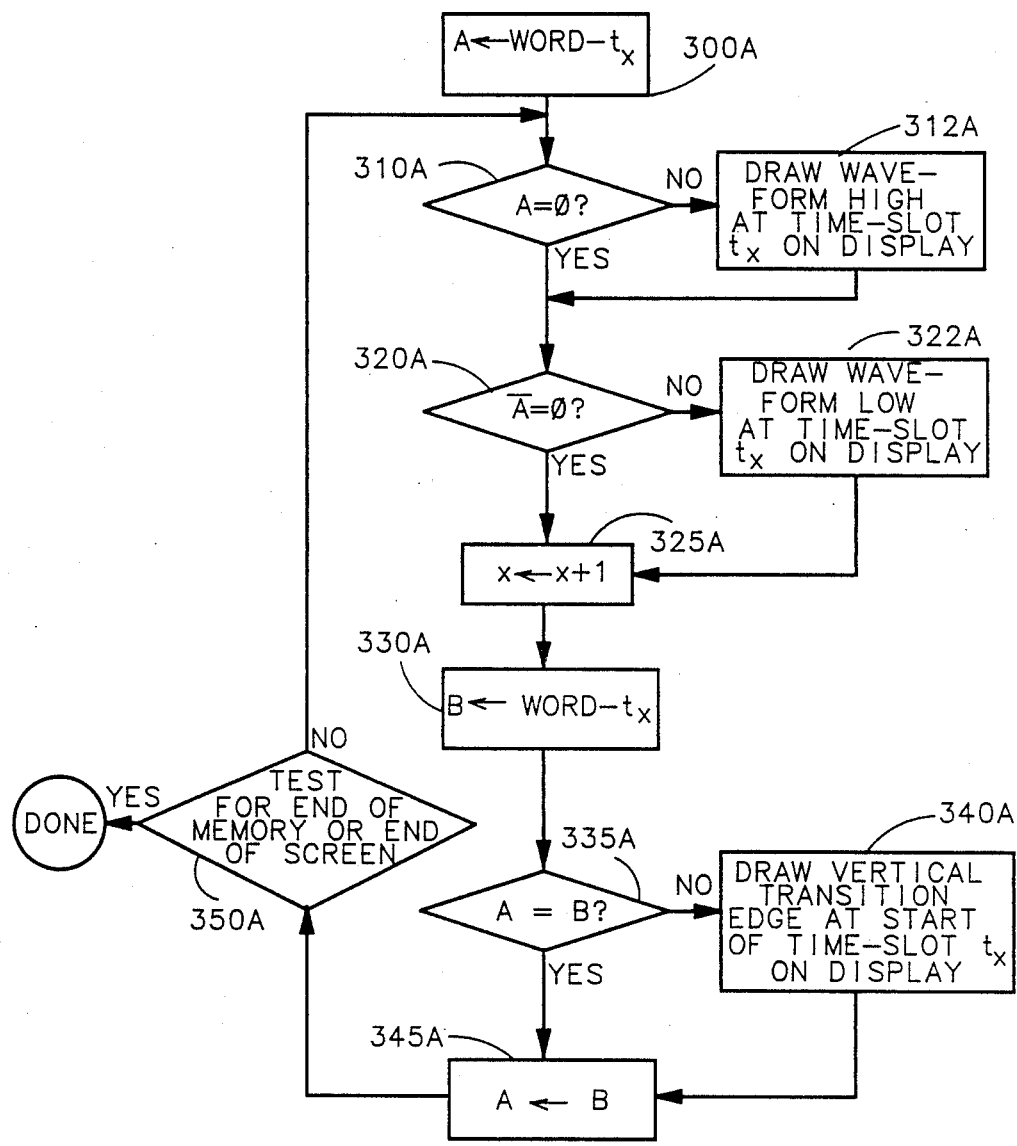
FIG. 8A shows the steps in the parallel method of FIG. 8.

FIG. 8A shows the steps in the parallel method of FIG. 8. Given digitized waveform information in memory (such as the digitized information in memory 300 of FIG. 8) the first step, step 300A, of the parallel method is to read the first parallel word of the waveform information, word-$t_x$, into memory register A. The next step, step 310A, is a test to determine if the word-$t_x$ equals zero. If word-$x$ does not equal zero, then step 312 is executed wherein the waveform is drawn high on the display screen at the time-unit-$t_x$ corresponding to word-$t_x$. The next step 320A is a test to determine if the A-complement, that is, the complement of word-$t_x$, is equal to zero. If so, then in step 322A the waveform is drawn low on the display screen at the time-unit-$t_x$ corresponding to the word-$t_x$. The memory address index x is then incremented in step 325A and the next word in memory is then read into register B in step 330A. A test is then made in step 335A to determine if A equals B, that is, if word-$t_x$ equals word-$t_{x+1}$. If not, then in step 340A a vertical transition edge is drawn on the display screen at the intersection of the time units on the display screen which correspond to the words in registers A and B. In the next step 345A, the word in register B is substituted for the word in register A and the method loops back to step 310A. This looping may continue until all of the digitized information in memory is read or the corresponding waveform is drawn across the display screen as tedted for in step 350A. As an example, one may apply the parallel method as defined in FIG. 8A to the memory 300 in FIG. 8 as shown below, noting, however, that the example begins with $t=t_{n+11}$ so as to show how the vertical transition edges are drawn:

(See FIG. 8A as applied to word-$t_{n+11}$ of FIG. 8.)
Step 300A: register A=word-$t_x$=word-$t_{n+11}$=1001;
Step 310A: 1001 does NOT equal zero, go to Step 312A;
Step 312A: segmental waveform 360 of FIG. 8 is drawn high on display screen at time-unit-$t_{n+11}$ corresponding to the word in register A;
Step 315A: complement A, that is, 1001 becomes 0110;
Step 320A: 0110 does NOT equal zero, go to Step 322A;
Step 322A: segmental waveform 360 of FIG. 8 is drawn low on display screen at time-unit-$t_{n+11}$ corresponding to word in register A;
Step 325A: increment memory word address index x;
Step 330A: register B=word-$t_x$=word-$t_{n+12}$=1000;
Step 335A: A does NOT equal B, that is, 1001 does NOT equal 1000, go to Step 340A;
Step 340A: a vertical transition edge is drawn at the start of time-unit-tx, that is, timeslot-$t_{n+12}$ in waveform 365 of FIG. 8;
Step 345A: substitute the contents of register B for the contents of register A, and loop back to Step 310 unless done.

I claim:

1. A waveform display for a logic analyzer said display being configurable into a plurality of portions wherein each portion is simultaneously visible, said display comprising:

a first portion of said display showing digital waveforms representative of a functional group of digital signals, said waveforms having a logic high level and a logic low level parallel to said logic high level and having vertical edges connecting perpendicular to said logic high and logic low levels, said edges indicating a transition from logic high to logic low or from logic low to logic high, said waveforms being superimposed onto each other such that all the transitions of said waveforms of said groups appear from left to right across said display at a single height level of said display;

a second portion of said display showing at least a single digital waveform in isolation from said first overlaid portion of said display;

means for electronically sampling a first digital signal at predetermined periodic intervals to acquire samples of the value of said signal at said intervals;

means for digitizing said samples in the order in which they were acquired such that if a sample is equal to or above a predetermined threshold value it is digitized to one binary value and if a sample is below said predetermined threshold value it is digitized to a complementary binary value;

means for storing said binary values in bits in memory in the order in which they were digitized such that the binary values for a given signal are stored in a sequence of bits, said bits having the same bit position in a sequence of memory words; and means for mapping one said sequence of bits onto a display, said display having a horizontal time axis, said time axis having a finite number of discrete time-units.

2. The waveform display for a logic analyzer of claim 1 wherein the means for electronically sampling the first digital signal, the means for digitizing the samples and the means for storing the binary values are applied in parallel to a parallel set of digital input signals, said parallel signals being input in parallel to a logic analyzer on a digital signal bus.

3. A method for overlaying logic analyzer digital signal waveforms comprising the steps of:
(a) electronically sampling a first digital signal at predetermined periodic intervals to acquire samples of the value of said signal at said intervals;
(b) digitizing said samples in the order in which they were acquired such that if a sample is equal to or above a predetermined threshold value it is digitized to one binary value and if a sample is below said predetermined threshold value it is digitized to a complementary binary value;
(c) storing said binary values in bits in memory in the order in which they were digitized such that the binary values for a given signal are stored in a sequence of bits, said
(d) mapping one said sequence of bits onto a display, said display having a horizontal time axis, said time axis having a finite number of discrete time-units, said display further being configurable into a plurality of portions wherein each portion is simultaneously visible, said display comprising a first portion of said display showing digital waveforms representative of a functional group of digital signals said waveforms having a logic high level and a logic low level parallel to said logic high level and having vertical edges connecting perpendicular to said logic high and logic low levels, said edges indicating a transition from logic high to logic low or from logic low to logic high, said waveform being superimposed onto each other such that all the transitions of said waveforms of said groups appear from left to right across said display at a single height level of said display; and a second portion of said display showing at least a single digital waveform in isolation from said first overlaid portion of said display;
(e) mapping said sequence of bits onto said display such that the order of each bit in the sequence of bits bears a predetermined relation to said time axis such that each bit corresponds to a predetermined time-unit on said time axis;
(f) mapping said sequence of bits onto said display such that one binary value represents logic high and the opposite binary value represents logic low;
(g) mapping said sequence of bits onto said display such that logic high is represented by a horizontal line parallel to the axis of the display and logic low is represented by a parallel line at a fixed distance below the level of logic high and a transition from logic high to logic low or from logic low to logic high is represented by a vertical line connecting perpendicular to the logic high and logic low lines;
(h) mapping said sequence of bits onto said display such that the waveform for said first digital signal resembles a square-wave drawn from left-to-right across said display starting at a predetermined level on said display;
(j) drawing additional waveforms superimposed onto the waveform of step (h) to form an overlaid waveform display by applying steps (d) through (h) to additional sequences of bits.

4. The method of claim 3 wherein steps (a) through (c) are applied in parallel to a parallel set of digital input signals, said parallel signals being input in parallel to a logic analyzer on a digital signal bus.

5. A method for overlaying logic analyzer digital signal waveforms comprising the steps of:
(a) electronically sampling a first digital signal at predetermined periodic intervals to acquire samples of the value of said signal at said intervals;
(b) digitizing said samples in the order in which they were acquired such that if a sample is equal to or above a predetermined threshold value it is digitized to one binary value and if a sample is below said predetermined threshold value it is digitized to a complementary binary value;
(c) storing said binary values in bits in memory in the order in which they were digitized such that the binary values for a given signal are stored in a sequence of bits, said bits having the same bit position in a sequence of memory words;
(d) mapping one said sequence of bits onto a display, said display having a horizontal time axis, said time axis having a finite number of discrete time-units, said display further being configurable into a plurality of portions wherein each portion is simultaneously visible, said display comprising a first portion of said display showing digital waveforms representative of a functional group of digital signals said waveforms having a logic high level and a logic low level and having vertical edges connecting perpendicular to said logic high and logic low levels, said edges indicating a transition from logic high to logic low or from logic low to logic high, said waveforms being superimposed onto each other such that all the transitions of said waveforms of said groups appear from left to right across said display at a single height level of said display and a second portion of said display showing at least a single digital waveform in isolation from said first overlaid portion of said display;
(e) mapping said sequence of bits onto said display such that the order of each bit in the sequence of bits bears a predetermined relation to said time axis such that each bit corresponds to a predetermined time-unit on said time axis;
(f) mapping said sequence of bits onto said display such that one binary value represents logic high and the opposite binary value represents logic low;
(g) mapping said sequence of bits onto said display such that logic high is represented by a horizontal line parallel to the time axis of the display and logic low is represented by a parallel line at a fixed distance below the level of logic high and a transition from logic high to logic low or from logic low to logic high is represented by a vertical line connecting perpendicular to the logic high and logic low lines;
(h) mapping said sequence of bits onto said display such that the waveform for said first digital signal resembles a square-wave drawn from left-to-right across said display starting at a predetermined level on said display;

(j) drawing additional waveforms superimposed onto the waveform of step (h) to form an overlaid waveform display by applying steps (d) through (h) to additional sequences of bits;

(k) alternating between said superimposed waveforms display of the first portion of an isolated waveform display of the second portion.

6. the method of claim 5:

wherein the resolution of the superimposed waveforms displayed in the first portion is at least as precise as the resolution of any one of isolated waveforms displayed in the second portion.

7. A waveform display for a logic analyzer said display comprising:

(a) means for electronically sampling a first digital signal at predetermined periodic intervals to acquire samples of the value of said signal at said intervals;

(b) means for digitizing said sample in the order in which they were acquired such that if a sample is equal to or above a predetermined threshold value it is digitized to one binary value and if a sample is below said predetermined threshold value it is digitized to a complementary binary value;

(c) means for storing said binary values in bits in memory in the order in which they were digitized such that the binary values for a given signal and stored in a sequence of bits, said bits having the same bit position in a sequence of memory words;

(d) means for mapping one said sequence of bits onto a display, said display having a horizontal time axis, said time axis having a finite number of discrete time-units, said display further being configurable into a plurality of portions wherein each portion is simultaneously visible, said display comprising a first portion of said display showing digital waveforms representative of a functional group of digital signals said waveforms having a logic high level and a logic low level and having vertical edges connecting perpendicular to said logic high and logic low levels, said edges indicating a transition from logic high to logic low or from logic low to logic high said waveforms being superimposed onto each other such that all transitions of said waveforms of said groups appear from left to right across said display at a single height level of said display, and a second portion of said display showing at least a single digital waveform in isolation from said first overlaid portion of said display;

(e) means for mapping said sequence of bits onto said display such that the order of each bit in the sequence of bits bears a predetermined relation to said time axis such that each bit corresponds to a predetermined time-unit on said time axis;

(f) means for mapping said sequence of bits onto said display such that one binary value represents logic high and the opposite binary value represents logic low;

(g) means for mapping said sequence of bits onto said display such that logic high is represented by a horizontal line parallel to the time axis of the display and logic low is represented by a parallel line at a fixed distance below the level of logic high and a transition from logic high to logic low or from logic low to logic high is represented by a vertical line connecting perpendicular to the logic high and logic low lines;

(h) means for mapping said sequence of bits onto said display such that the waveform for said first digital signal resembles a square-wave drawn from left-to-right across said display starting at a predetermined level on said display;

(j) means for drawing additional waveforms superimposed onto the waveform for said first digital signal to form an overlaid waveform display by applying each means for mapping to additional sequences of bits; and (k) means for alternating between said superimposed waveforms display of the first portion and an isolated waveform display of the second portion.

8. The waveform display for a logic analyzer of claim 7:

wherein the resolution of the superimposed waveforms displayed in the first portion is at least as precise as the resolution of any one of isolated waveforms displayed in the second portion.

* * * * *